United States Patent
Ryu et al.

(10) Patent No.: US 7,656,926 B2
(45) Date of Patent: Feb. 2, 2010

(54) OPTICAL CONNECTION DEVICE AND METHOD OF FABRICATING THE SAME

(75) Inventors: Han-youl Ryu, Hwaseong-si (KR); Kyoung-ho Ha, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 70 days.

(21) Appl. No.: 12/153,650

(22) Filed: May 22, 2008

(65) Prior Publication Data

US 2009/0175307 A1   Jul. 9, 2009

(30) Foreign Application Priority Data

Jan. 9, 2008   (KR) .................... 10-2008-0002640

(51) Int. Cl.
*H01S 5/00* (2006.01)

(52) U.S. Cl. ................ 372/50.21; 372/50.124

(58) Field of Classification Search ............... 372/50.1, 372/50.21, 50.124
See application file for complete search history.

(56) References Cited

U.S. PATENT DOCUMENTS 6,586,776 B1 *   7/2003   Liu ........................... 257/98

* cited by examiner

*Primary Examiner*—Armando Rodriguez
(74) *Attorney, Agent, or Firm*—Harness, Dickey & Pierce, P.L.C.

(57) ABSTRACT

Provided is an optical connection device and a method of fabricating the same. The optical connection device includes a laser diode formed on a substrate, a photodiode that is formed on the laser diode and has an aperture which is an exit of light emitted from the laser diode, and a plurality of electrode pads connected to electrodes for the laser diode and the photodiode on the substrate. A direction in which the light of the laser diode is emitted is opposite to a bonding direction between the laser diode and the substrate with respect to the laser diode.

12 Claims, 4 Drawing Sheets

US 7,656,926 B2

OPTICAL CONNECTION DEVICE AND METHOD OF FABRICATING THE SAME

CROSS-REFERENCE TO RELATED PATENT APPLICATION

This application claims the benefit of Korean Patent Application No. 10-2008-0002640, filed on Jan. 9, 2008, in the Korean Intellectual Property Office, the disclosure of which is incorporated herein in its entirety by reference.

BACKGROUND OF THE INVENTION

1. Field of the Invention

The present invention relates to an optical connection device and a method of fabricating the same, and more particularly, to an optical connection device in which a laser diode and a photodiode are included in one chip, and a method of fabricating the same.

2. Description of the Related Art

In high speed semiconductor devices, there are a limit in signal transmission speed and a limit in large capacity high speed transmission due to cross-talk caused by complicated wirings, the limitation of packaging density, and electromagnetic interference (EMI). As a means for addressing these problems in signal transmission, an optical interconnection technique that uses light for signal transmission between semiconductor devices has drawn attention.

Generally, in order to transmit a signal, a transmitter that send a signal and a receiver that receives the signal are necessary, and there are many cases that the signal transmission must be transmitted in bi-directions. For example, an input/output terminal of a semiconductor memory functions as a bi-directional terminal, that is, an input terminal of 'writing data' and an output terminal of 'read data'.

Generally, a semiconductor laser diode (LD) is used as a device for transmitting an optical signal and a photodiode (PD) is used as a device for receiving the optical signal. A vertical cavity surface emitting laser (VCSEL) that has low power consumption, oscillates in a vertical direction to a substrate, and is easily arranged in multi-channels is mainly used as the LD. In most bi-directional optical connection modules. The LD and the PD are separated, and thus, data transmission and data receiving are separately achieved.

Thus, in the prior art, since an LD and a PD are separately used, a bi-directional connection is achieved through two optical fibers. Thus, the configuration of the communication system is complicated resulting in high manufacturing costs.

SUMMARY OF THE INVENTION

To address the above and/or other problems, the present invention provides an optical connection device that enables bi-directional connections by forming a laser diode and a photodiode in one chip, and a method of fabricating the same.

According to an aspect of the present invention, there is provided an optical connection device comprising: a laser diode formed on a substrate; a photodiode that is formed on the laser diode and has an aperture which is an exit of light emitted from the laser diode; and a plurality of electrode pads connected to electrodes for the laser diode and the photodiode on the substrate, wherein a direction in which the light of the laser diode is emitted is opposite to a bonding direction between the laser diode and the substrate with respect to the laser diode.

The laser diode may have a bottom emission structure.

The laser diode may be a vertical cavity surface emitting laser (VCSEL).

The photodiode may comprise an aperture through which light from the laser diode is emitted.

The laser diode and the photodiode may be flip chip bonded with the electrode pads.

According to an aspect of the present invention, there is provided a method of fabricating an optical connection device, comprising: forming a photodiode layer on a first substrate; forming a laser diode layer on the photodiode layer; forming a laser diode structure by etching the laser diode layer; forming a pad layer covering a side of the laser diode structure on the first substrate; forming a first metal post connected to a lower electrode of the laser diode and a second metal post connected to an electrode formed on the photodiode layer in the pad layer; flip chip bonding the first substrate and a second substrate on which electrode pads are formed to correspond to the first and second metal posts and an upper electrode of the laser diode so that the electrode pads of the second substrate are connected to the first and second metal posts and the upper electrode of the laser diode; and forming an aperture for emitting the laser light from the laser diode by etching the photodiode layer so as to be exposed a predetermined region of the laser diode.

The forming of the first and second metal posts may comprise: etching a region of the pad layer where the first and second metal posts are formed; and forming the first and second metal posts in the etched region using an electroplating method.

The pad layer may be formed of polyimide or epoxy.

The first and second metal posts may be formed of Au.

The method may further comprise forming an etch stopper on the first substrate before forming the photodiode layer.

The method may further comprise removing the first substrate before forming the aperture.

The forming of the aperture may further comprise: forming a first through hole by patterning a region of the photodiode layer and the laser diode layer corresponding to the second metal post; forming an insulating layer to form a second through hole on a sidewall of the first through hole; and forming an electrode connected to the second metal post on the photodiode layer by filling the second through hole with a metal material.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
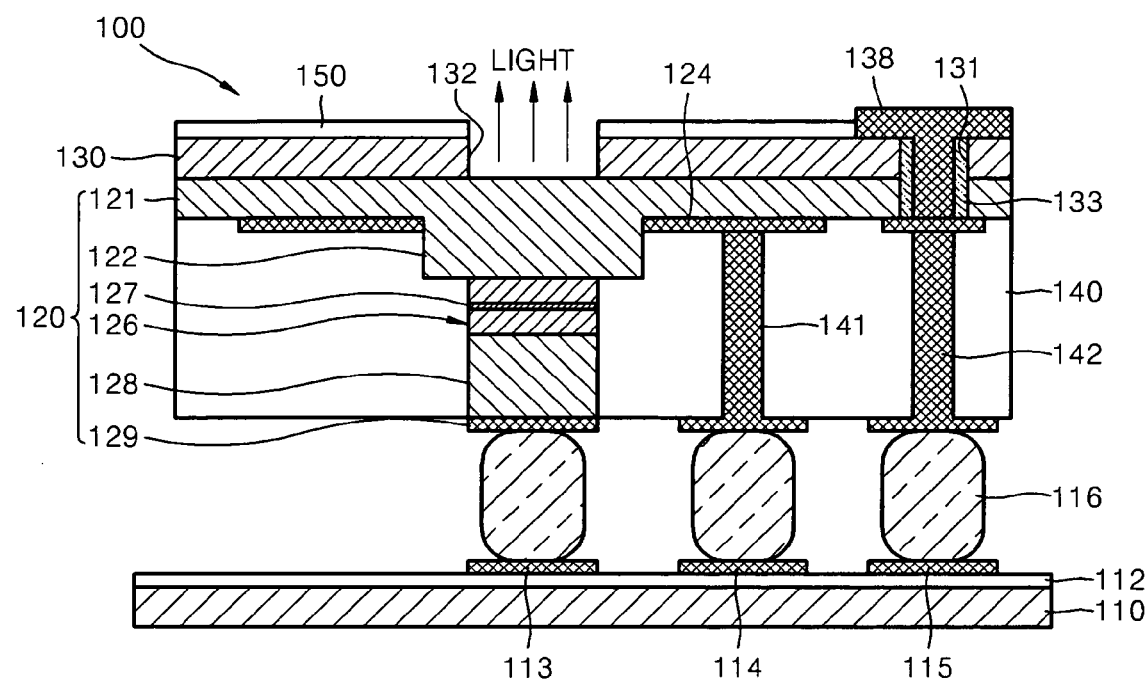
FIG. 1 is a cross-sectional view of an optical connection device according to an embodiment of the present invention.

The present invention will now be described more fully with reference to the accompanying drawings, in which exemplary embodiments of the invention are shown. In the drawings, like reference numerals denote like elements. In the drawings, the thicknesses of layers and regions are exaggerated for clarity. It will also be understood that when a layer is referred to as being "on" another layer or substrate, it may be directly on the other layer or substrate, or intervening layers may also be present.

FIG. 1 is a schematic cross-sectional view of an optical connection device 100 according to an embodiment of the present invention.

Referring to FIG. 1, the optical connection device 100 includes a laser diode 120 and a photodiode 130 sequentially formed on a substrate 110. Electrode pads 113, 114, and 115 are formed on the substrate 110, and the electrode pads 113, 114, and 115, a p-electrode 129 and an n-electrode 124 of the laser diode 120, and a photodiode electrode 138 are flip-chip bonded by indium bumpers 116.

The laser diode 120 may be a vertical cavity surface emitting laser (VCSEL). The laser diode 120 includes an n mirror 122 formed on a GaAs substrate 121, a cavity 126 including an active layer 127, a p mirror 128, and the p electrode 129 sequentially formed on the n mirror 122, and the n electrode 124 formed on the substrate 121.

The n mirror 122 is formed to have a reflectivity lower than that of the p mirror 128, and thus, light emitted from the active layer 127 is emitted through the n mirror 122. Accordingly, the laser diode 120 is a bottom type laser diode. The laser diode 120 emits light having a wavelength of 850 nm which is a standard wavelength used in an optical interconnection. The light emitted in this way is emitted upward when it is viewed in FIG. 1.

The photodiode 130 has an aperture 132 in a region corresponding to the n mirror 122, and thus, light emitter from the laser diode 120 is not absorbed to the photodiode 130.

If the substrate 110 is a silicon substrate, an insulating layer 112, for example, a silicon oxide layer is further formed between the substrate 110 and the electrode pads 113, 114, and 115.

A metal post 141 formed by electroplating is disposed between the n electrode 124 of the laser diode 120 and the electrode pad 114 to electrically connect them. The photodiode electrode 138 connected to the photodiode 130 is connected to the electrode pad 115 via another metal post 142, and for this purpose, a through hole 131 is formed in the substrate 121 and the photodiode 130. The metal post 142 is disposed separately from the through hole 131 in the through hole 131 by intermediating an insulating layer 140 therebetween.

An etch stopper 150, which will be described later, is formed on the photodiode 130.

The structure of the optical connection device 100 may be further known through a method of fabricating the optical connection device 100 described below.

FIGS. 2A through 2E are cross-sectional views illustrating a method of fabricating an optical connection device 100 of FIG. 1, according to an embodiment of the present invention.

Figure 2A:
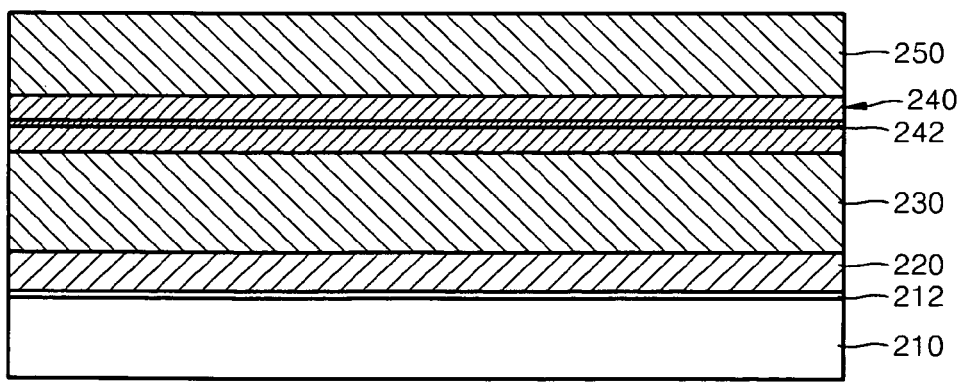
FIGS. 2A through 2E are cross-sectional views illustrating a method of fabricating an optical connection device according to an embodiment of the present invention.

Referring to FIG. 2A, a PD layer 220 and a VCSEL layer are sequentially formed on a GaAs substrate 210. An etch stopper 212 that will be used for removing the GaAs substrate 210 in a subsequent process may further be formed between the PD layer 220 and the GaAs substrate 210.

The PD layer 220 may be formed to have a thickness, for example, approximately 1 μm to sufficiently absorb light having a wavelength of 850 nm. The PD layer 220 may include a p doped layer (not shown) and an intrinsic layer (not shown), and may be a P—I—N structure with an n doped layer which is a lower mirror layer 230.

The etch stopper 212 may be formed of $AlxGa1-xAs$, where x>0.5 so that a selective etching may be achieved with GaAs.

The VCSEL layer includes the lower mirror layer 230, a cavity layer 240, and an upper mirror layer 250 sequentially formed on the PD layer 220.

The lower mirror layer 230 may be formed by doping an n-type dopant while repeatedly growing two materials having different compositions such as $AlxGa1-xAs/AlyGa1-yAs$. The lower mirror layer 230 is formed in a distributed Bragg reflector (DBR) structure. The lower mirror layer 230 is a layer on which an n mirror is formed.

The cavity layer 240 may include an active layer 242 which is a multiple-quantum-well (MQW) layer formed of GaAs/ $AlxGa1-xAs$. A barrier layer formed of AlGaAs may be formed on and under the active layer 242. The active layer 242 emits light having a wavelength of 850 nm which is an infrared ray standard wavelength.

The upper mirror layer 250 may be formed by doping a p-type dopant while repeatedly growing two materials having different compositions such as $AlxGa1-xAs/AlyGa1-yAs$. The upper mirror layer 250 is formed in a DBR (distributed Bragg reflector) structure. The upper mirror layer 250 is a layer on which a p mirror is formed. The upper mirror layer 250 may be formed to have a reflectivity higher than that of the lower mirror layer 230 so that light emitted from the active layer 242 may be emitted towards the lower mirror layer 230.

Figure 2B:
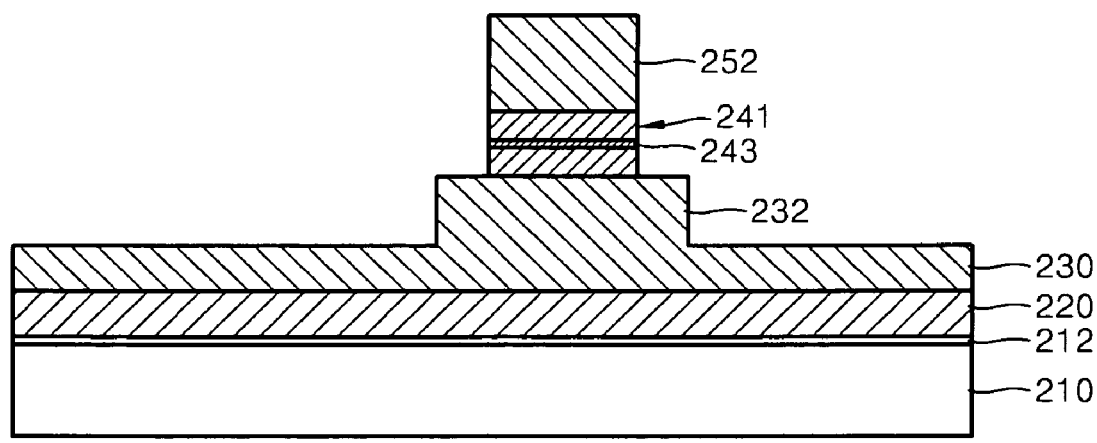

Referring to FIG. 2B, in order to form an oscillation region of the VCSEL, a mesa structure is formed by etching the VCSEL layer. The upper mirror layer 250 is etched to an upper mirror (p-mirror) 252, the cavity layer 240 is etched to a cavity 241 that includes an active layer 243, and the lower mirror layer 230 is etched to a structure that includes a lower mirror (n-mirror) 232.

Figure 2C:
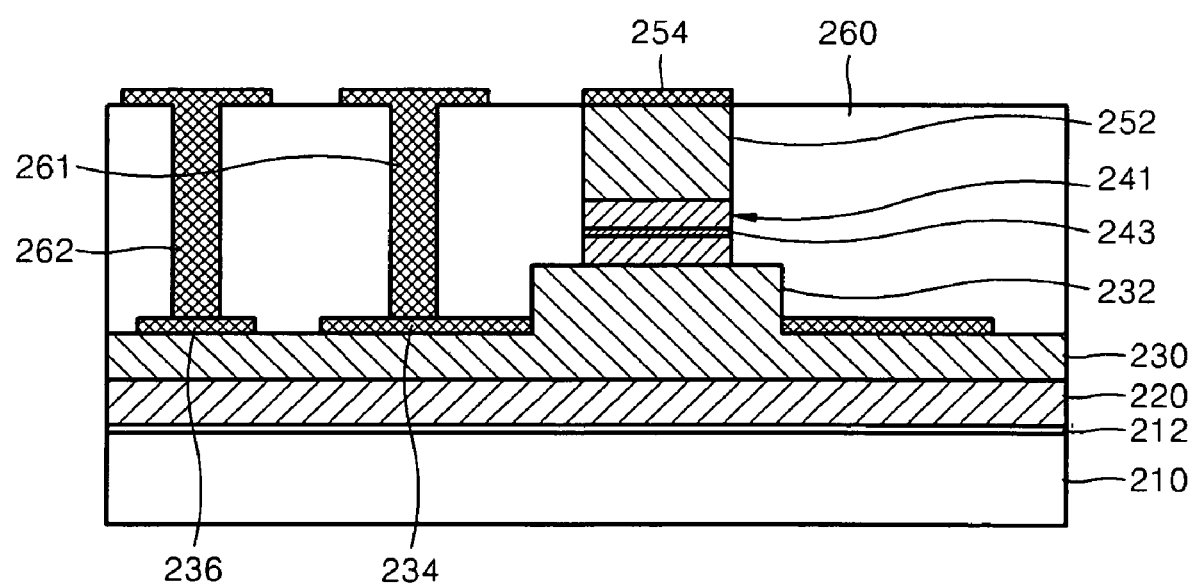

Referring to FIG. 2C, a p electrode 254 on the p-mirror 252, an n electrode on the lower mirror layer 230, and an electrode seed layer 236 for a PD on the lower mirror layer 230 are formed. The n electrode 234 is a common electrode as an n electrode used for measuring a current of the PD, and a ground voltage may be applied to the n electrode 234.

A pad layer 260 covering side surfaces of the mesa structure is formed on the GaAs substrate 210 for forming a pad for flip chip bonding. The pad layer 260 may be formed of polyimide or epoxy.

A region of the pad layer 260 corresponding to the n electrode 234 and the electrode seed layer 236 is etched. Metal posts 261 and 262 respectively are formed on the n electrode 234 and the electrode seed layer 236 using an electroplating method. The metal posts 261 and 262 may be formed of Au.

Figure 2D:
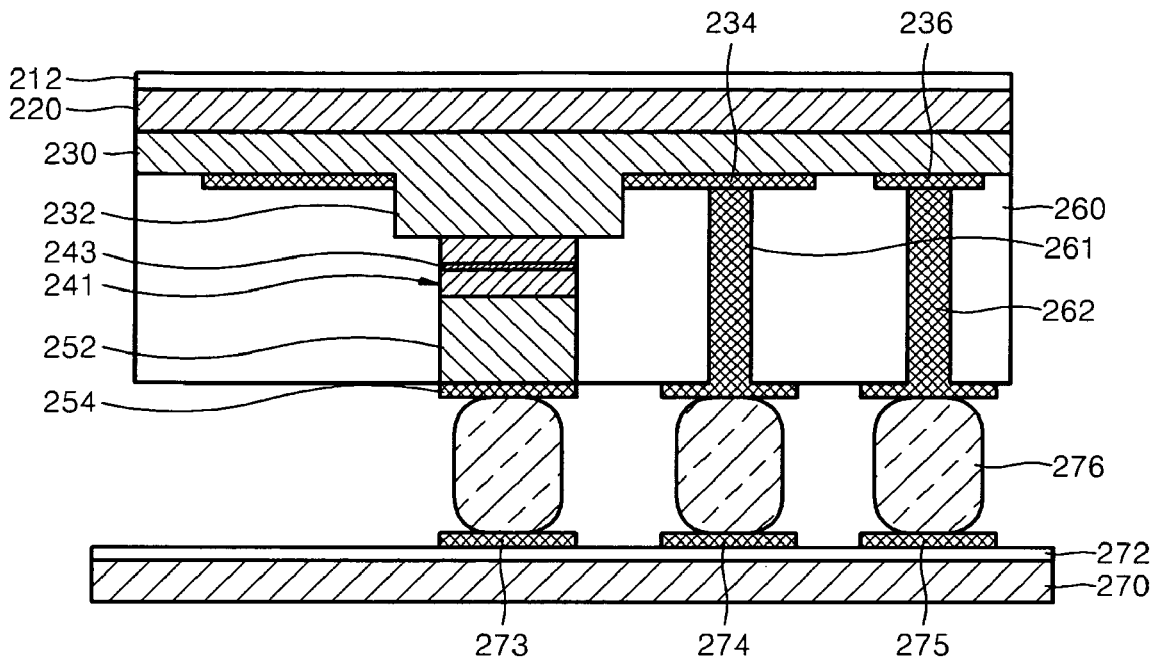

Referring to FIG. 2D, the structure described above is flip chip boned to another substrate 270, for example, a silicon substrate 270. A silicon insulating layer 272 is formed on the silicon substrate 270, and electrode pads 273, 274, and 275 respectively corresponding to the p electrode 254 and the metal posts 261 and 262 are formed on the silicon insulating layer 272. For flip chip bonding, indium bumpers 276 are used. A printed circuit board may be used instead of the silicon substrate 270.

After flip chip bonding, the GaAs substrate 210 is removed. The GaAs substrate 210 may be removed if a solution that selectively etches the GaAs substrate 210, and thus, the AlGaAs etch stopper 212 remains.

Figure 2E:
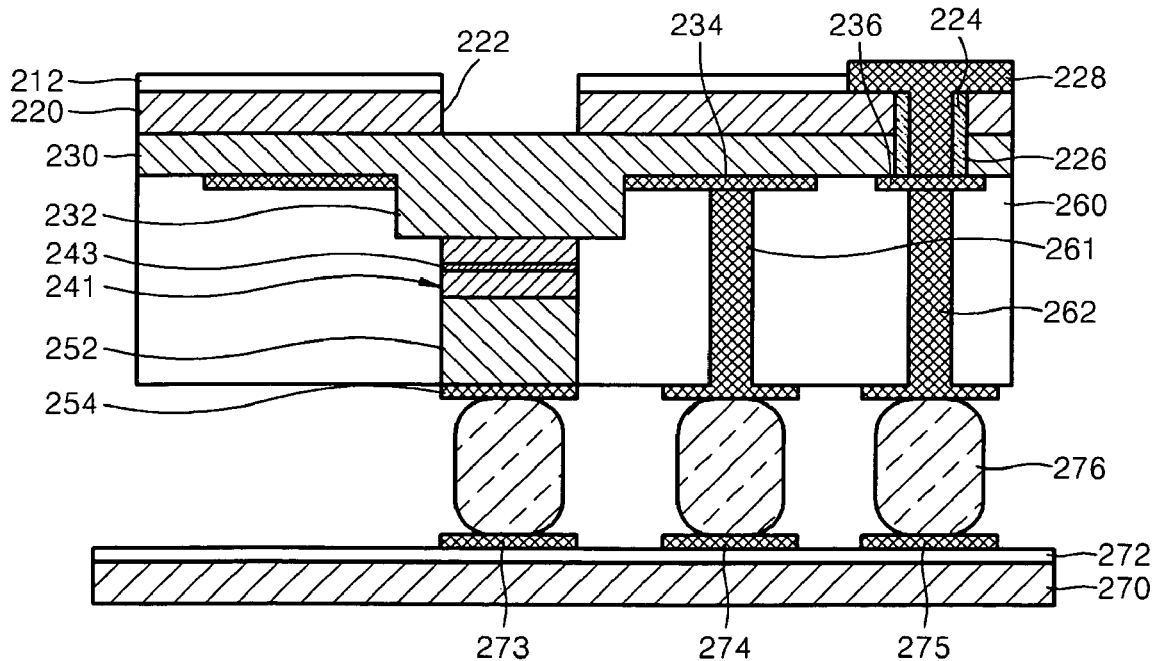

Referring to FIG. 2E, an aperture 222 through which laser light of the VCSEL is emitted is formed by etching a portion of the etch stopper 212 and the PD layer 220. A through hole 224 is formed in the etch stopper 212, the PD layer 220 and the lower mirror layer 230 on a region corresponding to the metal post 262. After filling the through hole 224 with an insulating layer 226, another through hole (not shown) is formed by etching the insulating layer 226. Next, an electrode pad 228 is formed on the PD layer 220 by filling the another though hole with an electrode material. The electrode pad 228 is electrically connected to the metal post 262.

Figure 3:
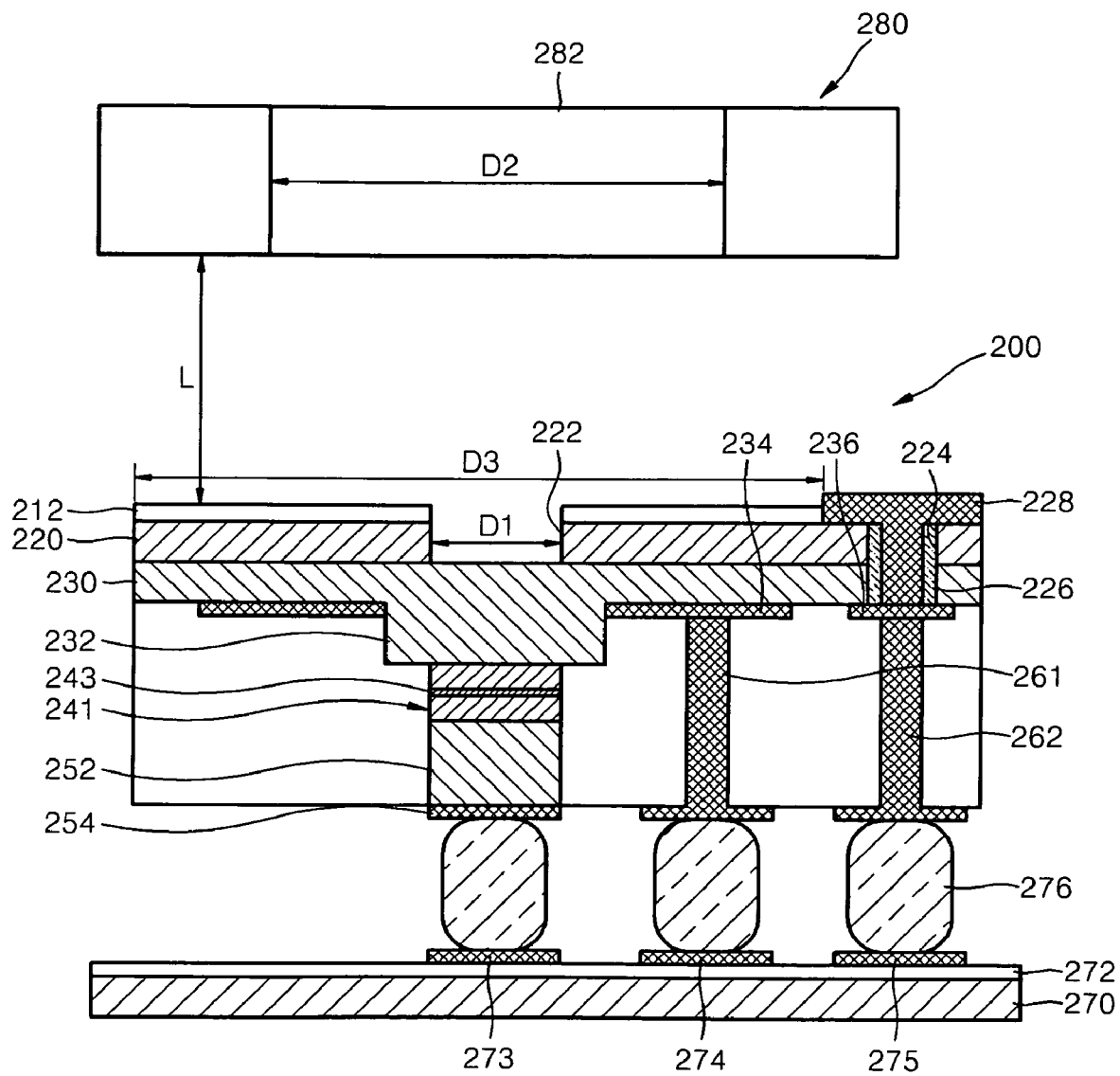
FIG. 3 is a cross-sectional view for explaining a method of operating an optical connection device according to an embodiment of the present invention.

FIG. 3 is a cross-sectional view for explaining a principle of operating an optical connection device according to an embodiment of the present invention. Like reference numerals are used to indicate elements that are substantially identical to the elements of FIGS. 2A through 2E, and thus the detailed description thereof will not be repeated.

Referring to FIG. 3, an optical fiber 280 used for optical communication is disposed on an optical connection device 200 according to an embodiment of the present invention. Laser light oscillated from a VCSEL is coupled to the optical fiber 280 through an aperture 222. Generally, a diameter D1 of the VCSEL aperture 222 is 10 to 30 μm, a diameter D2 of a core 282 of the optical fiber 280 is 50 to 100 μm, and a distance L between the VCSEL aperture 222 and the optical fiber 280 is 50 to 200 μm, and thus, majority of the laser light of the VCSEL is coupled to the optical fiber 280. Laser light emitted from the optical fiber 280 is absorbed to the PD 220, however, since a diameter D3 of the PD 220 is 50 to 100 μm, the coupling efficiency may be reduced according to the distance between the optical fiber 280 and the PD 220. In the optical connection device 200 according to an embodiment of the present invention, a direction in which the light is inputted and outputted is opposite to a direction in which an electrical signal is inputted and outputted through the flip chip bonding structure. Accordingly, no hindrances such as bonding wires are present between the PD 220 and the optical fiber 280, and thus, it is possible for the PD 220 to approach to the optical fiber 280 within a distance of approximately 50 μm. Thus, it is anticipated that the optical connection device of the present invention has an improved coupling efficiency compared to a connection device using a wire bonding structure. Of the laser light emitted from the optical fiber 280 to the PD 220, the laser light that incident to a region corresponding to the VCSEL aperture 222 is not incident to the PD 220, and this results in the reduction of coupling efficiency. However, since the region corresponding to the VCSEL aperture 222 is very small compared to the entire region of the PD 220, the reduction of the coupling efficiency may be said very little. For example, the diameter of the VCSEL aperture 222 is 15 μm, and the diameter of the PD 220 is 70 μm, an area occupied by the VCSEL aperture 222 is less than 5% of the total area of the PD 220.

According to the present invention, the optical connection device according to the present invention has a flip chip bonding structure. Thus, various problems caused in a conventional wire bonding structure may be addressed. In the flip chip bonding structure, the length of electrical wires is short compared to the wire bonding structure and inductance due to a wire loop may be reduced, and thus, a high speed data transmission of 10 GHz or above is possible. Also, a direction in which light is inputted and outputted is separately opposite to a direction in which an electrical signal is inputted and outputted, and thus, a space that is occupied by the optical connection chip is much simplified compared to the conventional wire bonding method. And it is easy to form a multi-channel VCSEL/PD array such as a two dimensional array. Also, the flip chip bonding structure according to the present invention is advantageous in durability and reliability compared to the conventional wire bonding, and is also advantageous in mass production.

According to the present invention, since an LD and a PD are fabricated in one device, a bi-directional optical connection may be realized, and thus, cost and space may be reduced since it requires only one waveguide.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An optical connection device comprising:
   a laser diode formed on a substrate;
   a photodiode that is formed on the laser diode and has an aperture which is an exit of light emitted from the laser diode; and
   a plurality of electrode pads connected to electrodes for the laser diode and the photodiode on the substrate,
   wherein a direction in which the light of the laser diode is emitted is opposite to a bonding direction between the laser diode and the substrate with respect to the laser diode.

2. The optical connection device of claim 1, wherein the laser diode has a bottom emission structure.

3. The optical connection device of claim 2, wherein the laser diode is a vertical cavity surface emitting laser (VCSEL).

4. The optical connection device of claim 1, wherein the photodiode comprises an aperture through which light from the laser diode is emitted.

5. The optical connection device of claim 1, wherein the laser diode and the photodiode are flip chip bonded with the plurality of electrode pads.

6. A method of fabricating an optical connection device, comprising:
   forming a photodiode layer on a first substrate;
   forming a laser diode layer on the photodiode layer;
   forming a laser diode structure by etching the laser diode layer;
   forming a pad layer covering a side of the laser diode structure on the first substrate;
   forming a first metal post connected to a lower electrode of the laser diode and a second metal post connected to an electrode formed on the photodiode layer in the pad layer;
   flip chip bonding the first substrate and a second substrate on which electrode pads are formed to correspond to the first and second metal posts and an upper electrode of the laser diode so that the electrode pads of the second substrate are connected to the first and second metal posts and the upper electrode of the laser diode; and
   forming an aperture for emitting the laser light from the laser diode by etching the photodiode layer so as to be exposed a predetermined region of the laser diode.

7. The method of claim 6, wherein the forming of the first and second metal posts comprises:
   etching a region of the pad layer where the first and second metal posts are formed; and
   forming the first and second metal posts in the etched region using an electroplating method.

8. The method of claim 6, wherein the forming of the pad layer comprises forming the pad layer using polyimide or epoxy.

9. The method of claim 6, wherein the first and second metal posts are formed of Au.

10. The method of claim 6, further comprising forming an etch stopper layer on the first substrate, wherein the forming the photodiode layer comprises forming the photodiode layer on the etch stopper layer.

11. The method of claim 6, further comprising removing the first substrate before the forming of the aperture.

12. The method of claim 11, wherein the forming of the aperture further comprises:

forming a first through hole by patterning a region of the photodiode layer and the laser diode layer corresponding to the second metal post;

forming an insulating layer to form a second through hole on a sidewall of the first through hole; and forming an electrode connected to the second metal post on the photodiode layer by filling the second through hole with a metal material.

* * * * *